(12) United States Patent
Oh

(10) Patent No.: US 12,108,550 B2
(45) Date of Patent: Oct. 1, 2024

(54) ELECTRONIC DEVICE INCLUDING HINGE MODULE

(71) Applicant: Samsung Electronics Co., Ltd., Gyeonggi-do (KR)

(72) Inventor: Chanhee Oh, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 276 days.

(21) Appl. No.: 17/701,858

(22) Filed: Mar. 23, 2022

(65) Prior Publication Data

US 2022/0264756 A1   Aug. 18, 2022

Related U.S. Application Data

(63) Continuation of application No. PCT/KR2022/002293, filed on Feb. 16, 2022.

(30) Foreign Application Priority Data

Feb. 18, 2021   (KR) .................. 10-2021-0021670

(51) Int. Cl.
*H05K 5/00*   (2006.01)
*F16C 11/04*   (2006.01)
*H05K 5/02*   (2006.01)

(52) U.S. Cl.
CPC ............ *H05K 5/0226* (2013.01); *F16C 11/04* (2013.01); *H05K 5/0017* (2013.01)

(58) Field of Classification Search
None
See application file for complete search history.

(56) References Cited

U.S. PATENT DOCUMENTS

2015/0366089 A1 * 12/2015 Park .................... H04M 1/0268
                                                              361/679.01
2016/0041589 A1    2/2016 Tazbaz
(Continued)

FOREIGN PATENT DOCUMENTS

CN    206309758 U    7/2017
CN    111536143 A    8/2020
(Continued)

OTHER PUBLICATIONS

International Search Report dated May 30, 2022.
Written Opinion dated May 30, 2022.

*Primary Examiner* — Anthony Q Edwards
*Assistant Examiner* — Rashen E Morrison
(74) *Attorney, Agent, or Firm* — Cha & Reiter, LLC

(57) ABSTRACT

According to an embodiment, an electronic device may include a first housing, a second housing, a hinge device configured to connect the first housing and the second housing to be foldable about a folding axis, and a flexible display arranged to be supported by at least a part of the first housing, the second housing, and the hinge device. The hinge device may include a hinge housing including an accommodation portion, at least one cam assembly arranged in the accommodation portion, at least two coil spring members providing a pressing force to the at least one cam assembly in a direction parallel to the folding axis, and at least one hinge plate configured to support the at least one cam assembly. The at least two coil spring members may be coiled in opposite directions. Various other embodiments may be possible.

20 Claims, 12 Drawing Sheets

(56) References Cited

U.S. PATENT DOCUMENTS

| | | |
|---|---|---|
| 2020/0097051 A1 | 3/2020 | Liu |
| 2020/0348732 A1 | 11/2020 | Kang et al. |
| 2021/0018960 A1* | 1/2021 | Kato .................... G06F 1/1618 |
| 2021/0044682 A1 | 2/2021 | Liu et al. |
| 2022/0116489 A1 | 4/2022 | Nagai et al. |

FOREIGN PATENT DOCUMENTS

| | | |
|---|---|---|
| KR | 20-0408470 Y1 | 2/2006 |
| KR | 10-0649142 B1 | 11/2006 |
| KR | 10-1731375 B1 | 4/2017 |
| KR | 10-2019-0097898 A | 8/2019 |
| KR | 10-2020-0126524 A | 11/2020 |
| KR | 10-2174853 B1 | 11/2020 |
| KR | 10-2022-0027710 A | 3/2022 |
| KR | 10-2022-0067310 A | 5/2022 |
| WO | 2020/259646 A1 | 12/2020 |

\* cited by examiner

ELECTRONIC DEVICE INCLUDING HINGE MODULE

CROSS-REFERENCE TO RELATED APPLICATION(S)

This application is a Continuation of and claims priority under 35 U.S.C. § 120 to PCT International Application No. PCT/KR2022/002293, which was filed on Feb. 16, 2022, and claims priority to Korean Patent Application No. 10-2021-0021670, filed on Feb. 18, 2021, in the Korean Intellectual Property Office, the disclosure of which are incorporated by reference herein their entirety.

BACKGROUND

Technical Field

One or more embodiments of the instant disclosure generally relate to an electronic device including a hinge module.

Description of Related Art

As electronic devices from various manufacturers have become increasingly commonplace, in order to satisfy consumer demand, electronic devices are becoming gradually slimmer and are being developed to increase the rigidity of the electronic devices and to enhance the design of the electronic devices. The electronic device are also being designed to include features that differentiate them from others in the marketplace.

Electronic devices may include a foldable electronic device that includes a first housing and a second housing rotatably connected to the first housing via a hinge device. The first housing and the second housing may be structurally coupled to a hinge module included in the hinge device, and may be operated while being supported by the hinge module when the device is folded and/or unfolded.

The foldable electronic device may perform a folding operation and/or an unfolding operation based on the hinge device.

SUMMARY

According to certain embodiments, electronic devices may include a foldable electronic device in which its screen may be expanded by performing a folding operation and/or an unfolding operation. As the screen of the electronic device is expanded, the electronic device may provide a greater number of functionality, such as allowing an electronic pen to be better utilized. In working with the electronic pen, a digitizer for recognizing inputs from the electronic pen may be included in the display module corresponding to the screen. In the electronic device, inputs from the electronic pen may be more accurately and precisely recognized via the digitizer. Since the electronic device includes the digitizer, it is necessary to manage the H-field of the magnetic field generated by the electronic pen and/or the digitizer.

An electronic device (e.g., foldable electronic device) can be repeatedly folded or unfolded via a hinge device, and the hinge device may be implemented with a metallic material (e.g., metal structures) to increase rigidity of the electronic device. In order to support the hinge operations of the metal structures, which incorporates a shaft, or to prevent wear of the metal structures, the hinge device may include one or more coil spring members. When the electronic device performs the folding operation and/or the unfolding operation, the coil spring members may be repeatedly compressed and then released. When the folding operation and/or the unfolding operation are performed, friction may occur between the metal structures constituting the hinge device, and static electricity may be generated and accumulated in the hinge device due to the friction. The coil spring members of the hinge device may at least partially generate a magnetic field based on the accumulated static electricity. For example, the magnetic field may at least partially magnetize the metal structures and may impair the H-field uniformity of the digitizer. In turn, the accuracy of the electronic pen via the digitizer may be deteriorated.

According to an embodiment, an electronic device may include a first housing, a second housing, a hinge device configured to connect the first housing and the second housing to be foldable about a folding axis, and a flexible display arranged to be supported by at least a part of the first housing, the second housing, and the hinge device. The hinge device may include a hinge housing including an accommodation portion, at least one cam assembly arranged in the accommodation portion, at least two coil spring members providing a pressing force to the at least one cam assembly in a direction parallel to the folding axis, and at least one hinge plate configured to support the at least one cam assembly and having a longitudinal length parallel to the folding axis. The at least two coil spring members may be coiled in opposite directions with respect to the folding axis.

According to an embodiment, a hinge device may include a hinge housing including an accommodation portion, and at least one hinge module arranged in one end and another end of the hinge housing. The at least one hinge module may include a first support member and a second support member including a first accommodation portion, which is a partial area of the accommodation portion, and configured to be foldable with about a folding axis, at least one cam assembly arranged in the accommodation portion, and at least two coil spring members configured to provide a pressing force to the at least one cam assembly in a direction parallel to the folding axis. The at least two coil spring members may be coiled in opposite directions with respect to the folding axis.

Additional aspects will be set forth in part in the description which follows and, in part, will be apparent from the description, or may be learned by practice of the presented embodiments.

BRIEF DESCRIPTION OF DRAWINGS

In connection with the description of the drawings, the same or similar components may be denoted by the same or similar reference numerals.

The above and other aspects, features, and advantages of certain embodiments of the present disclosure will be more apparent from the following description taken in conjunction with the accompanying drawings, in which.

DETAILED DESCRIPTION

According to certain embodiments of the disclosure, by implementing coiling directions for a plurality of adjacent coil spring members in opposite directions, it is possible to offset magnetic fields generated by the coil spring members.

According to certain embodiments of the disclosure, by eliminating static electricity generated due to repetitive folding and/or unfolding operations of the electronic device, it is possible to prevent the generation of a magnetic field (e.g., magnetization phenomenon). According to an embodiment, by implementing coiling directions of the plurality of adjacent coil spring members to be opposite to each other, it is possible to eliminate static electricity. According to an embodiment, since the H-field uniformity of the digitizer is maintained, the accuracy of the electronic pen can be improved. In addition, various effects directly or indirectly identified through the disclosure may be provided.

Figure 1:
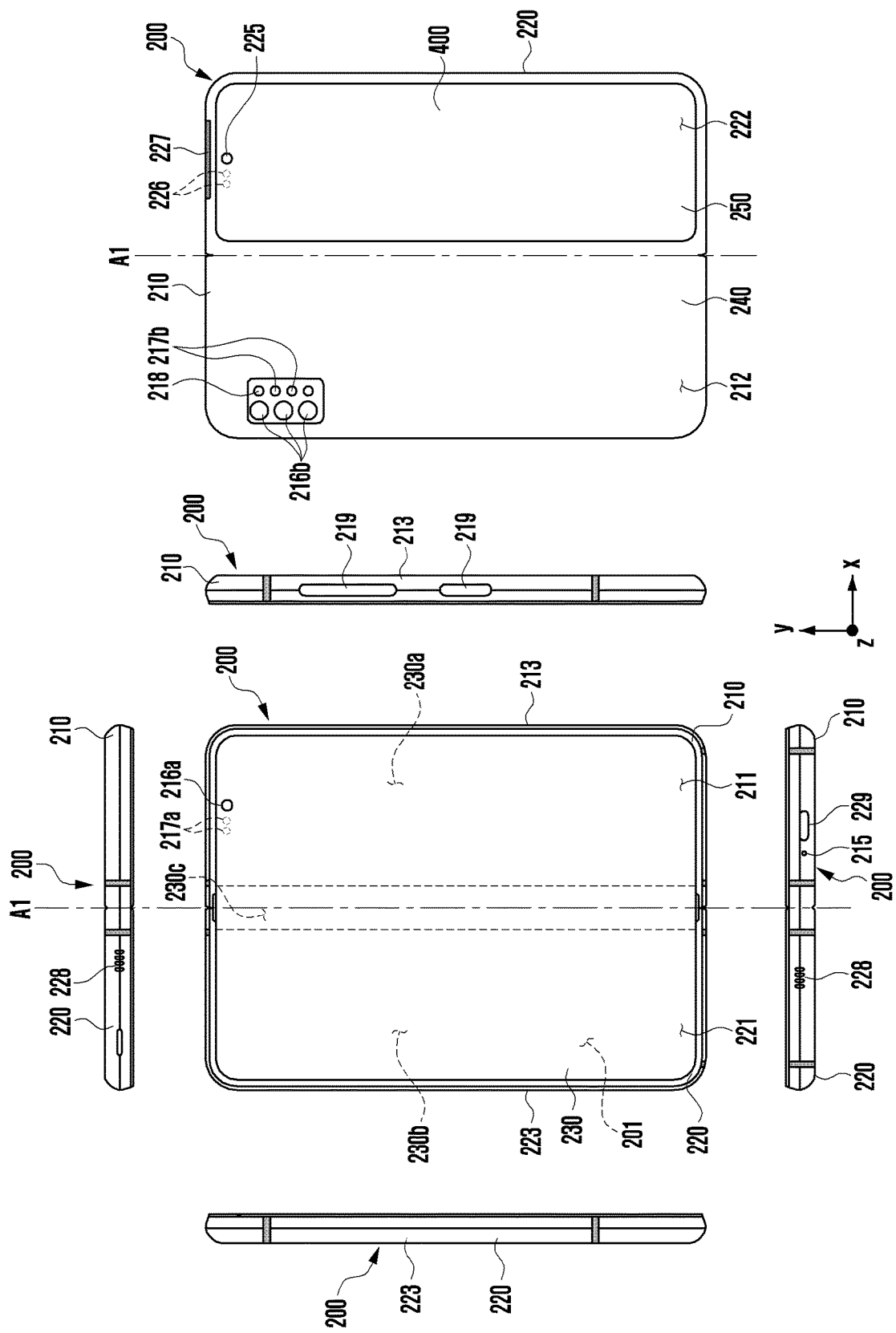
FIG. 1 is a view illustrating an electronic device according to an embodiment of the disclosure in an unfolded state.
Figure 2:
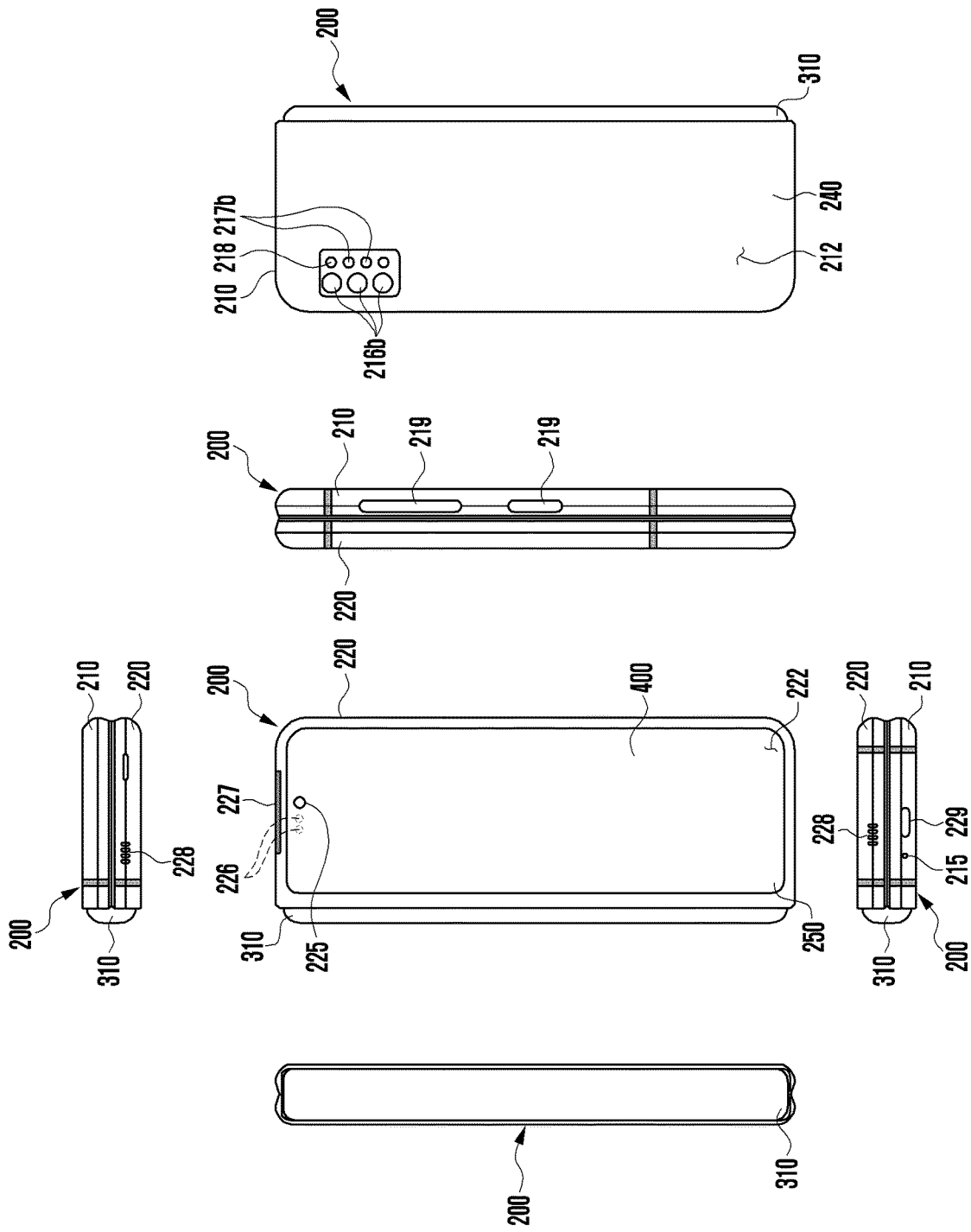
FIG. 2 is a view illustrating the electronic device of FIG. 1 according to an embodiment of the disclosure in a folded state.

FIG. 1 is a view illustrating an unfolded state of an electronic device 200 according to an embodiment of the disclosure. FIG. 2 is a view illustrating a folded state of an electronic device 200 of FIG. 1 according to an embodiment of the disclosure.

Referring to FIGS. 1 and 2, an electronic device 200 may include a pair of housings 210 and 220 (e.g., foldable housings) rotatably combined with each other based on a folding axis A1 through a hinge device (e.g., hinge device 300 of FIG. 3) so as to be folded with each other, a first display 230 (e.g., flexible display, foldable display, and/or main display) disposed through the pair of housings 210 and 220, and a second display 400 (e.g., sub-display). According to an embodiment, a hinge module (e.g., hinge module 320) of the hinge device (e.g., hinge device 300 of FIG. 3) may be disposed not to be seen from an outside through the first housing 210 and the second housing 220 in a folded state, and may be disposed not to be seen from the outside through a hinge housing 310 protecting the hinge device and covering a foldable part in an unfolded state. In the present document, a side on which the first display 230 is disposed may be defined as a front side of the electronic device 200, and an opposite side of the front side may be defined as a rear side of the electronic device 200. Further, a side surrounding a space between the front side and the rear side may be defined as a lateral side of the electronic device 200.

Figure 3:
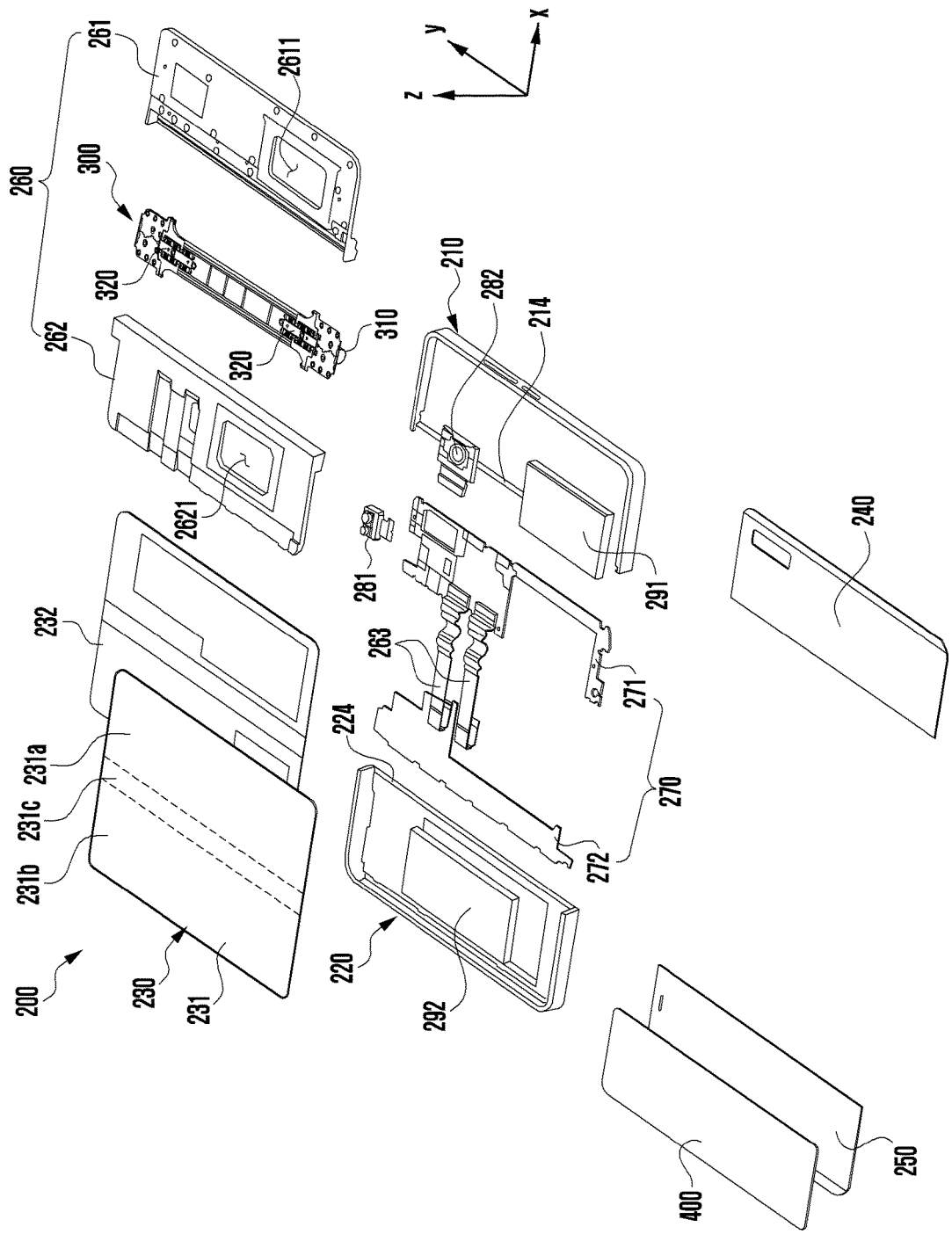
FIG. 3 is an exploded perspective view illustrating the electronic device according to an embodiment of the disclosure.

According to an embodiment, the pair of housings 210 and 220 may include the first housing 210 and the second housing 220 rotatably disposed to each other through the hinge device (e.g., hinge device 300 of FIG. 3). According to an embodiment, the pair of housings 210 and 220 may not be limited to the shape and combination as illustrated in FIGS. 1 and 2, and may be implemented by a different shape or part combinations and/or association. According to an embodiment, the first housing 210 and the second housing 220 may be disposed on both sides around the folding axis A1, and may have a symmetric shape as a whole about the folding axis A1. According to a certain embodiment, the first housing 210 and the second housing 220 may be asymmetrically folded based on the folding axis A1. According to an embodiment, the first housing 210 and the second housing 220 may have different angles or distances between them depending on whether the electronic device 200 is in an unfolded state, a folded state, or an intermediate state.

According to an embodiment, in the unfolded state of the electronic device 200, the first housing 210 may be connected to the hinge device (e.g., hinge device 300 of FIG. 3), and may include a first side 211 disposed to be directed toward the front side of the electronic device 200, a second side 212 directed toward an opposite direction of the first side 211, and a first side member 213 surrounding at least a part of a first space between the first side 211 and the second side 212. According to an embodiment, the second housing 220 may be connected to the hinge device (e.g., hinge device 300 of FIG. 3) in the unfolded state of the electronic device 200, and may include a third side 221 disposed to be directed toward the front side of the electronic device 200, a fourth side 222 directed toward an opposite direction of the third side 221, and a second side member 223 surrounding at least a part of a second space between the third side 221 and the fourth side 222. According to an embodiment, the first side 211 may be substantially directed in the same direction as that of the third side 221 in the unfolded state, and may face the third side 221 in the folded state. According to an embodiment, the electronic device 200 may include a recess 201 formed to accommodate the first display 230 through structural combination of the first housing 210 and the second housing 220. According to an embodiment, the recess 201 may have substantially the same size as that of the first display 230.

According to an embodiment, the hinge housing 310 may be disposed between the first housing 210 and the second housing 220 so as to hide the hinge device (e.g., hinge device 300 of FIG. 3). According to an embodiment, the hinge housing 310 may be hidden or exposed to an outside by parts of the first housing 210 and the second housing 220 depending on the unfolded state, the folded state, or the intermediate state of the electronic device 200. For example, in the unfolded state of the electronic device 200, the hinge housing 310 may be hidden by the first housing 210 and the second housing 220, and may not be exposed. According to an embodiment, in case that the electronic device 200 is in the folded state, the hinge housing 310 may be exposed to the outside between the first housing 210 and the second housing 220. According to an embodiment, in case of the intermediate state where the first housing 210 and the second housing 220 are folded with a certain angle, the hinge housing 310 may be at least partly exposed to the outside of the electronic device 200 between the first housing 210 and the second housing 220. For example, an area in which the hinge housing 310 is exposed to the outside may be smaller than that in a completely folded state. According to an embodiment, the hinge housing 310 may include a curved side.

According to an embodiment, in case that the electronic device 200 is in the unfolded state (e.g., state of FIG. 1), the first housing 210 and the second housing 220 form an angle of 180 degrees, and a first area 230a, a folding area 230c, and a second area 230b of the first display 230 may be disposed to form a plane and to be directed in the same direction. As another embodiment, in case that the electronic device 200 is in the unfolded state, the first housing 210 may be rotated at an angle of 360 degrees against the second housing 220, and may be reversely folded so that the second side 212 and the fourth side 222 face each other (out folding type).

According to an embodiment, in case that the electronic device 200 is in the folded state (e.g., state of FIG. 2), the first side 211 of the first housing 210 and the third side 221 of the second housing 220 may be disposed to face each other. In this case, the first area 230a and the second area 230b of the first display 230 may form a narrow angle (e.g., in the range of 0 to 10 degrees) with each other through the folding area 230c, and may be disposed to face each other. According to an embodiment, at least a part of the folding area 230c may be formed as a curved side having a certain curvature radius. According to an embodiment, in case that the electronic device 200 is in the intermediate state, the first housing 210 and the second housing 220 may be disposed with a certain angle. In this case, the first area 230a and the second area 230b of the first display 230 may form an angle that is larger than the angle in the folded state and smaller than the angle in the unfolded state, and the curvature radius of the folding area 230c may be larger than that in the folded state. In a certain embodiment, the first housing 210 and the second housing 220 may form a designated folding angle at which they stop folding between the folded state and the unfolded state through the hinge device (e.g., hinge device 300 of FIG. 3) (free stop function). In a certain embodiment, the first housing 210 and the second housing 220 may operate as being pressed in a folding direction or in an unfolding direction based on a designated inflection angle through the hinge device (e.g., hinge device 300 of FIG. 3).

According to an embodiment, the electronic device 200 may include at least one of displays 230 and 400 disposed on the first housing 210 and/or the second housing 220, an input device 215, sound output devices 227 and 228, sensor modules 217a, 217b, and 226, camera modules 216a, 216b, and 225, a key input device 219, an indicator (not illustrated), or a connector port 229. In a certain embodiment, the electronic device 200 may omit at least one of constituent elements, or may additionally include at least one of other constituent elements.

According to an embodiment, the at least one display 230 and 400 may include the first display 230 (e.g., flexible display) disposed to be supported by the third side 221 of the second housing 220 through the hinge device (e.g., hinge device 300 of FIG. 3) from the first side 211 of the first housing 210, and the second display 400 disposed to be seen from the outside through the fourth side 222 in the inner space of the second housing 220. As another example, the second display 400 may be arranged in the inner space of the housing 210 to be visible from the outside through the second surface 212.

According to an embodiment, the first display 230 may be mainly used in the unfolded state of the electronic device 200, and the second display 400 may be mainly used in the folded state of the electronic device 200. According to an embodiment, in the intermediate state of the electronic device 200, the first display 230 or the second display 400 may be used based on the folding angle of the first housing 210 and the second housing 220.

According to an embodiment, the first display 230 may be disposed in a space formed by the pair of housings 210 and 220. For example, the first display 230 may be seated in a recess 201 formed by the pair of housings 210 and 220, and may be disposed to occupy substantially most of the front side of the electronic device 200. According to an embodiment, the first display 230 may include the flexible display of which at least a partial area can be transformed into a planar or curved side. According to an embodiment, the first display 230 may include the first area 230a facing the first housing 210, the second area 230b facing the second housing 220, and the folding area 230c connecting the first area 230a and the second area 230b, and facing the hinge device (e.g., hinge device 300 of FIG. 3). According to an embodiment, the area division of the first display 230 is merely an exemplary physical division by a pair of housings 210 and 220 and the hinge device (e.g., hinge device 300 of FIG. 3), and the first display 230 may substantially display one seamless full screen through the pair of housings 210 and 220 and the hinge device (e.g., hinge device 300 of FIG. 3). According to an embodiment, the first area 230a and the second area 230b may have a symmetric shape as a whole based on the folding area 230c, or may have a partly asymmetric shape.

According to an embodiment, the electronic device 200 may include a first rear cover 240 disposed on the second side 212 of the first housing 210, and a second rear cover 250 disposed on the fourth side 222 of the second housing 220. In a certain embodiment, at least a part of the first rear cover 240 may be formed in a body with the first side member 213. In a certain embodiment, at least a part of the second rear cover 250 may be formed in a body with the second side member 223. According to an embodiment, at least one of the first rear cover 240 and the second rear cover 250 may be formed through a substantially transparent plate (e.g., glass plate including various coating layers or polymer plate) or an opaque plate. According to an embodiment, the first rear cover 240 may be formed through the opaque plate, such as coated or colored glass, ceramic, polymer, metal (e.g., aluminum, stainless steel (STS), or magnesium), or a combination of at least two of the above materials. According to an embodiment, the second rear cover 250 may be formed through a substantially transparent plate, such as glass or polymer. Accordingly, the second display 400 may be disposed to be seen from the outside through the second rear cover 250 in the inner space of the second housing 220.

According to an embodiment, the input device 215 may include a microphone. In a certain embodiment, the input device 215 may include a plurality of microphones disposed to be able to detect the direction of sound. According to an embodiment, the sound output devices 227 and 228 may include speakers. According to an embodiment, the sound output devices 227 and 228 may include a call receiver 227 disposed through the fourth side 222 of the second housing 220 and an external speaker 228 disposed through the side member of the second housing 220. In a certain embodiment, the input device 215, the sound output devices 227 and 228, and the connector 229 may be disposed in the spaces of the first housing 210 and/or the second housing 220, and may be exposed to an external environment through at least one hole formed on the first housing 210 and/or the second housing 220. In a certain embodiment, the holes formed on the first housing 210 and/or the second housing 220 may be commonly used for the input device 215 and the sound output devices 227 and 228. In a certain embodiment, the sound output devices 227 and 228 may include a speaker (e.g., piezo-electric speaker) operating in a state where the holes formed on the first housing 210 and/or the second housing 220 are excluded.

According to an embodiment, the camera modules 216a, 216b, and 225 may include the first camera module 216a disposed on the first side 211 of the first housing 210, the second camera module 216b disposed on the second side 212 of the first housing 210, and/or the third camera module 225 disposed on the fourth side 222 of the second housing 220. According to an embodiment, the electronic device 200 may include a flash 218 disposed near the second camera module 216b. According to an embodiment, the flash 218 may include, for example, a light emitting diode or a xenon lamp. According to an embodiment, the camera modules 216a, 216b, and 225 may include one or a plurality of lenses, an image sensor, and/or an image signal processor. In a certain embodiment, at least one of the camera modules 216a, 216b, and 225 may include two or more lenses (wide-angle lens and telephoto lens) and image sensors, and may be disposed together on any one side of the first housing 210 and/or the second housing 220.

According to an embodiment, the sensor modules 217a, 217b, and 226 may generate electrical signals or data values corresponding to an internal operation state of the electronic device 200 or an external environment state. According to an embodiment, the sensor modules 217a, 217b, and 226 may include the first sensor module 217a disposed on the first side 211 of the first housing 210, the second sensor module 217b disposed on the second side 212 of the first housing 210, and/or the third sensor module 226 disposed on the fourth side 222 of the second housing 220. In a certain embodiment, the sensor modules 217a, 217b, and 226 may include at least one of a gesture sensor, a grip sensor, a color sensor, an infrared (IR) sensor, an illuminance sensor, an ultrasonic sensor, an iris recognition sensor, or a distance detection sensor (TOF sensor or RiDAR scanner).

According to an embodiment, the electronic device 200 may further include at least one of non-illustrated sensor modules, for example, a barometric pressure sensor, a magnetic sensor, a biosensor, a temperature sensor, a humidity sensor, or a fingerprint recognition sensor. In a certain embodiment, the fingerprint recognition sensor may be disposed through at least one of the first side member 213 of the first housing 210 and/or the second side member 223 of the second housing 220.

According to an embodiment, the key input device 219 may be disposed to be exposed to the outside through the first side member 213 of the first housing 210. In a certain embodiment, the key input device 219 may be disposed to be exposed to the outside through the second side member 223 of the second housing 220. In a certain embodiment, the electronic device 200 may not include parts or all of the above-mentioned key input devices 219, and the key input device 219 that is not included may be implemented in other forms, such as a soft key, on the at least one display 230 and 400. As another embodiment, the key input device 219 may be implemented using a pressure sensor included in the at least one display 230 and 400.

According to an embodiment, the connector port 229 may accommodate connectors (e.g., USB connector or interface connector port (IF) module) for transmitting or receiving a power and/or data to or from an external electronic device. In a certain embodiment, the connector port 229 may perform a function for transmitting or receiving an audio signal to or from the external electronic device together, or may further include a separate connector port (e.g., ear-jack hole) for performing audio signal transmission/reception.

According to an embodiment, at least one camera device 216a and 225 among the camera modules 216a, 216b, and 225, at least one sensor module 217a and 226 among the sensor modules 217a, 217b, and 226, and/or the indicator may be disposed to be exposed through the at least one display 230 and 400. For example, the at least one camera modules 216a and 225, the at least one sensor module 217a and 226, and/or the indicator may be disposed under a display area of the display 230 in the inner space of the at least one housing 210 and 220, and may be disposed to come in contact with the external environment through an opening perforated up to the cover member (e.g., window layer (not illustrated) of the first display 230 and/or the second rear cover 250). According to an embodiment, areas in which the displays 230 and 400 and one or more camera module 216a and 225 overlap may be formed as a transmission area having a predetermined transmittance as a part of the content display area. According to an embodiment, the transmission area may have a transmittance in the range of about 5% to about 20%. The transmission area may include an area overlapping the effective area (e.g., view angle area) of at least one camera module 216a or 225 through which light may pass through the transmission area to be captured by an image sensor to generate an image. For example, the transmission area of the displays 230 and 400 may include an area having a lower pixel density than other areas of the displays 230 and 400. For example, the transmission area may replace the opening. For example, the at least one camera module 216a or 225 may include an under-display camera (UDC). As another embodiment, some camera modules or sensor modules 217a and 226 may be arranged to perform the functions thereof without being visually exposed through the display. For example, the areas facing the camera modules 216a and 225 and/or the sensor modules 217a and 226 arranged under the displays 230 and 400 (e.g., a display panel) have an under-display camera (UDC) structure, and thus the electronic device may not require a perforated opening.

FIG. 3 is an exploded perspective view of an electronic device 200 according to an embodiment of the disclosure.

Referring to FIG. 3, the electronic device 200 may include the first display 230, the second display 400, a support member assembly 260, at least one printed circuit board 270, the first housing 210, the second housing 220, the first rear cover 240, and the second rear cover 250.

According to an embodiment, the first display 230 may include a display panel 231 (e.g., flexible display panel), and one or more plates 232 or layers on which the display panel 231 (e.g., flexible display panel) is seated. According to an embodiment, a display panel 231 may include a first panel area 231a corresponding to a first area (e.g., the first area 230a in FIG. 1) of the display 230, a second panel area 231b extending from the first panel area and corresponding to a second area (e.g., the second area 230b in FIG. 1) of the display 230, and a third area 231c interconnecting the first panel area 231a and the second panel area 231b and corresponding to a folding area (e.g., the folding area 230c in FIG. 1) of the display 230. According to an embodiment, the one or more plates 232 may include a conductive plate (e.g., Cu sheet or SUS sheet) disposed between the display panel 231 and the support member assembly 260. According to an embodiment, the one or more plates 232 may be formed to have substantially the same area as that of the first display 230, and the area facing the folding area 230c of the first display 230 may be bendably formed. According to an embodiment, the one or more plates 232 may include at least one subsidiary material layer (e.g., graphite member) disposed on the rear side of the display panel 231. According to an embodiment, the one or more plates 232 may be formed in the shape corresponding to the display panel 231.

According to an embodiment, the second display 400 may be disposed in a space between the second housing 220 and the second rear cover 250. According to an embodiment, the second display 400 may be disposed to be seen from the outside through substantially the total area of the second rear cover 250 in the space between the second housing 220 and the second rear cover 250.

According to an embodiment, the support member assembly 260 may include a first support member 261 (e.g., the first support plate) and a second support member 262 (e.g., the second support plate). According to an embodiment, the first support member 261 may be rotatably coupled to the second support member 262 via the hinge device 300. According to one embodiment, the electronic device 200 may include at least one wiring member 263 (e.g., flexible printed circuit board (FPCB)) extending from at least a portion of the first support member 261 across the hinge device 300 to a portion of the second support member 262. According to an embodiment, the support member assembly 260 may be arranged between the at least one plate 232 and the at least one printed circuit board 270. According to an embodiment, the first support member 261 may be arranged between the first area (e.g., the first area 230a in FIG. 1) of the first display 230 and the first printed circuit board 271. According to an embodiment, the second support member 262 may be arranged between the second area (e.g., the second area 230b in FIG. 2) of the first display 230 and the second printed circuit board 272. According to an embodiment, at least a portion of the at least one wiring member 263 and/or the hinge device 300 may be arranged to be supported by at least a portion of the support member assembly 260. According to an embodiment, the at least one wiring member 263 may be arranged in a direction to be across the first support member 261 and the second support member 262 (e.g., in the x-axis direction). According to an embodiment, the at least one wiring member 263 may be arranged in a direction substantially perpendicular (e.g., in the x-axis direction) to the folding axis (e.g., the y-axis or the folding axis A1 in FIG. 1) of the folding area 230c.

According to an embodiment, the at least one printed circuit board 270 may include a first printed circuit board 271 disposed to face the first support member 261 and a second printed circuit board 272 disposed to face the second support member 262. According to an embodiment, the first printed circuit board 271 and the second printed circuit board 272 may be disposed in the inner space that is formed by the support member assembly 260, the first housing 210, the second housing 220, the first rear cover 240, and/or the second rear cover 250. According to an embodiment, the first printed circuit board 271 and the second printed circuit board 272 may include a plurality of electronic components disposed to implement various functions of the electronic device 200. In some embodiments, the first support member 261 is a component of the first housing 210 and may at least partially extend from the first side member 213 to a first space (e.g., first inner space) defined by the first housing 210. In some embodiments, the second support member 262 is a component of the second housing 220 and may at least partially extend from the second side member 223 to a second space (e.g., second inner space) defined by the second housing 220.

According to an embodiment, the electronic device 200 may include a first printed circuit board 271 arranged in the first space of the first housing 210, a first battery 291 arranged at a position facing a first swelling hole 2611 in the first support member 261, at least one camera module 282 (e.g., the first camera module 216a and/or the second camera module 216b in FIG. 1), or at least one sensor module 281 (e.g., the first sensor module 217a and/or the second sensor module 217b in FIG. 1). According to an embodiment, the electronic device 200 may include a second printed circuit board 272 arranged in the second space of the second housing 220, or a second battery 292 arranged at a position facing a second swelling hole 2621 in the second support member 262. According to an embodiment, the first housing 210 and the first support member 261 may be integrated with each other. According to an embodiment, the second housing 220 and the second support member 262 may be integrated with each other.

According to an embodiment, the first housing 210 may include a first rotation support side 214, and the second housing 220 may include a second rotation support side 224 corresponding to the first rotation support side 214. According to an embodiment, the first rotation support side 214 and the second rotation support side 224 may include a curved side corresponding (naturally connected) to a curved side included in the hinge housing 310. According to an embodiment, in the unfolded state of the electronic device 200, the first rotation support side 214 and the second rotation support side 224 may cover the hinge housing 310, and may not expose the hinge housing 310 to the rear side of the electronic device 200, or may minimally expose the hinge housing 310. According to an embodiment, in the folded state of the electronic device 200, the first rotation support side 214 and the second rotation support side 224 may be rotated along the curved side included in the hinge housing 310, and may maximally expose the hinge housing 310 to the rear side of the electronic device 200.

According to an embodiment, the hinge device 300 may include a hinge housing 310 and at least one hinge module 320 arranged in an accommodation portion (e.g., the accommodation portion 3101 in FIG. 4) of the hinge housing 310. According to an embodiment, the hinge module 320 may be fixed to the accommodation portion 3101 of the hinge housing 310, and may be connected to the first support member 261 and the second support member 262 via at least one rotator (e.g., the rotators 331, 332, 333, and 334 in FIG. 4A).

Figure 4A:
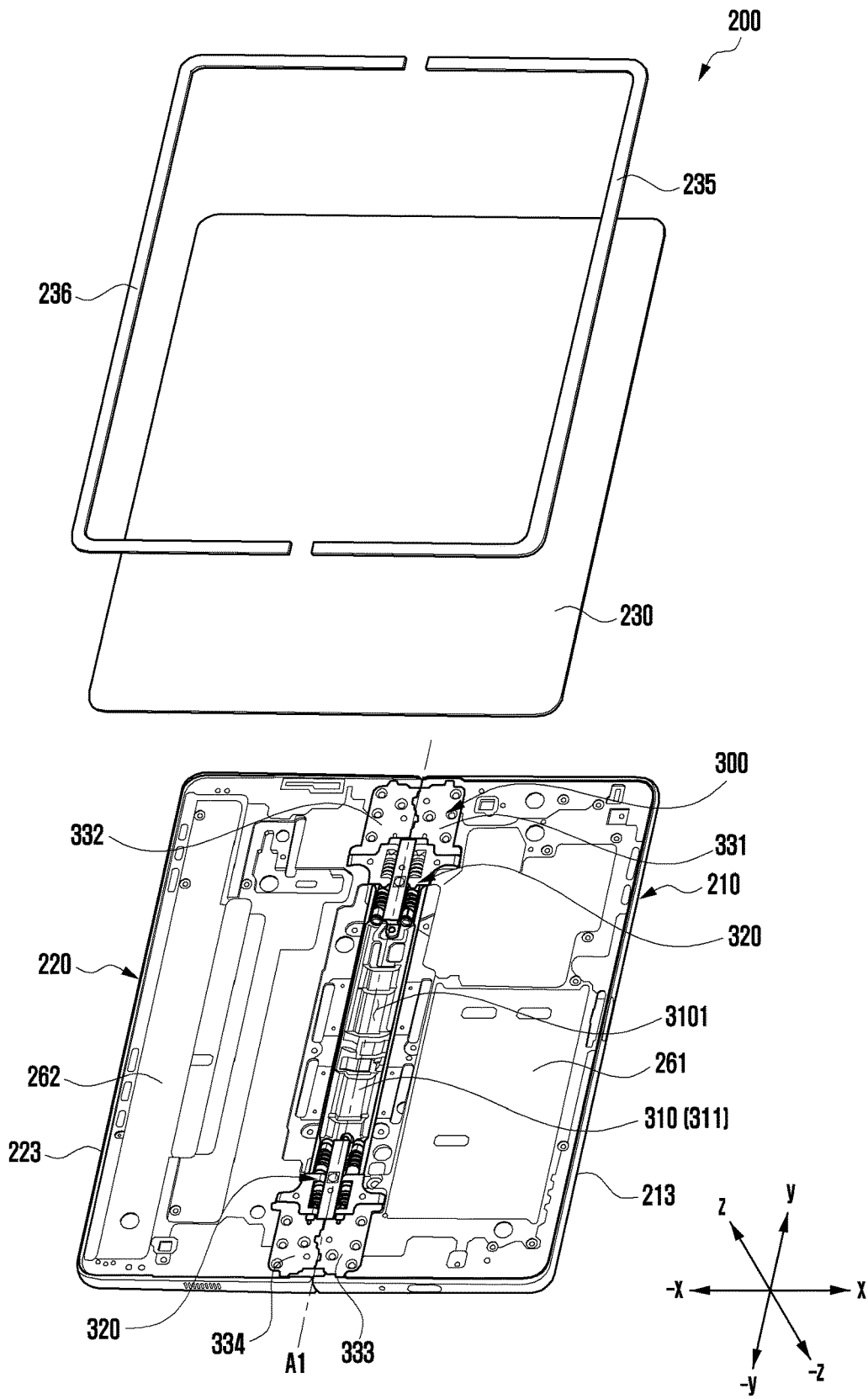
FIG. 4A is an exploded perspective view of an electronic device according to an embodiment of the disclosure.
Figure 4B:
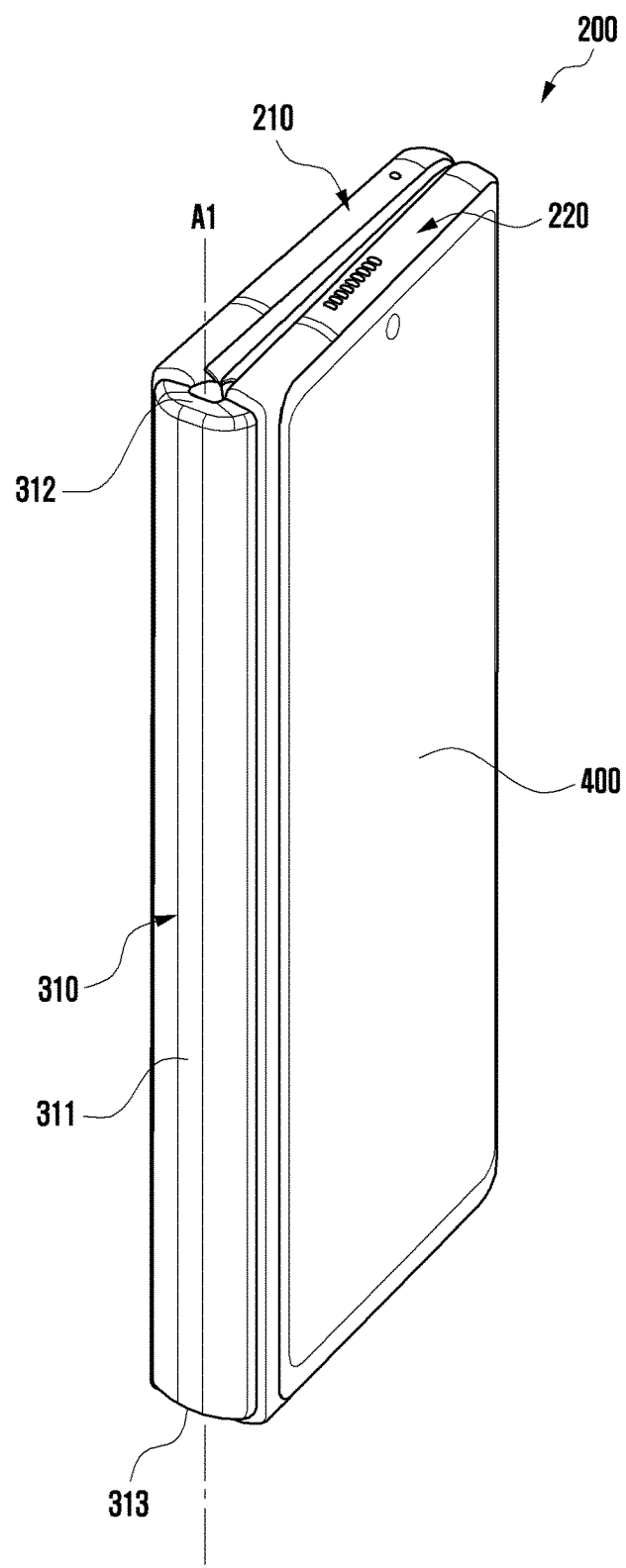
FIG. 4B is a perspective view illustrating the electronic device according to an embodiment of the disclosure in the folded state.

FIG. 4A is an exploded perspective view of the electronic device according to an embodiment of the disclosure. FIG. 4B is a perspective view illustrating the electronic device according to an embodiment of the disclosure in the folded state.

Referring to FIGS. 4A and 4B, the electronic device 200 includes a first housing 210 including a first side member 213, a second housing 220 including a second side member 223, a hinge device 300 interconnecting the first housing 210 and the second housing 220 to be rotatable relative to each other, and a display 230 (e.g., the first display 230 in FIG. 1) arranged to be supported by the first housing 210, the hinge device 300, and the second housing 220. According to an embodiment, the electronic device 200 may further include a first protective frame 235 coupled to the first housing 210 and a second protection frame 236 coupled to the second housing 220 with the edges of the display 230 interposed therebetween. According to an embodiment, the first housing 210 and the second housing 220 may be operated to be folded or unfolded relative to each other about the folding axis A1 via the hinge device 300.

According to an embodiment, the hinge device 300 may include a hinge housing 310 having a length in a direction substantially parallel to the folding axis A1 (e.g., the y-axis direction), the hinge device 300 including an accommodation portion 3101 and at least one hinge module 320 fixed to the accommodation portion 3101 of the hinge housing 310. According to an embodiment, the at least one hinge module 320 may include one or more rotators 331, 332, 333, or 334 in the shape of plates that are used to connect the first housing 210 and the second housing 220 to be foldable relative to each other. According to an embodiment, the hinge housing 310 may include a cover portion 311 arranged to have a length along the folding axis A1, a first closed end 312 extending from one end of the cover portion 311, and a second closed end 313 (a second closed end) extending from the other end of the cover portion 311. According to an embodiment, the accommodation portion 3101 may be provided by the cover portion 311, the first closed end 312, and the second closed end 313. According to an embodiment, the cover portion 311 may include a curved outer surface and, when folded, may be exposed to be at least partially visible to the outside. According to an embodiment, the accommodation portion 3101 may be opened in the direction toward the display 230 and may have a fixing structure and/or a seating structure to which at least one hinge module 320 can be fixed. According to an embodiment, the at least one hinge module 320 may provide a pressing force in the folded direction or the unfolded direction about an inflection point via a hinge shaft, a hinge cam, and a hinge spring, which are sequentially arranged in the direction substantially parallel to the folding axis A1, although the hinge shaft, the hinge cam, and the hinge spring are not denoted by reference numerals in FIGS. 4A-4B. During the folding operation and/or the unfolding operation of the electronic device, the pressing force may be provided via the cam member that presses the hinge cam in the longitudinal direction of the hinge shaft.

According to an embodiment, the one or more rotator 331, 332, 333, and 334 may include a first rotator 331 coupled to the first support member 261 of the first housing 210 near the first closed end 312, which is the upper area of the hinge housing 310, a second rotator 332 coupled to the second support member 262 of the second housing 220 near the first closed end 312, which is the upper area of the hinge housing, a third rotator 333 coupled to the first support member 261 of the first housing 210 near the second closed end 313, which is the lower area of the hinge housing 310, and a fourth rotator 334 coupled to the second support member 262 of the second housing 220 near the second closed end 313, which is the lower area of the hinge housing. According to an embodiment, the one or more rotators 331, 332, 333, and 334 may be coupled to the first support member 261 and the second support member 262 via fastening members such as screws. According to an embodiment, the hinge housing 310 may be connected to the first housing 210 and the second housing 220 via at least one hinge module 320. According to an embodiment, the at least one hinge module 320 including the one or more rotators 331, 332, 333, and 334 may be coupled to the first support member 261 and the second support member 262 to have a substantially flat surface in order to accommodate the display 230.

Figure 5:
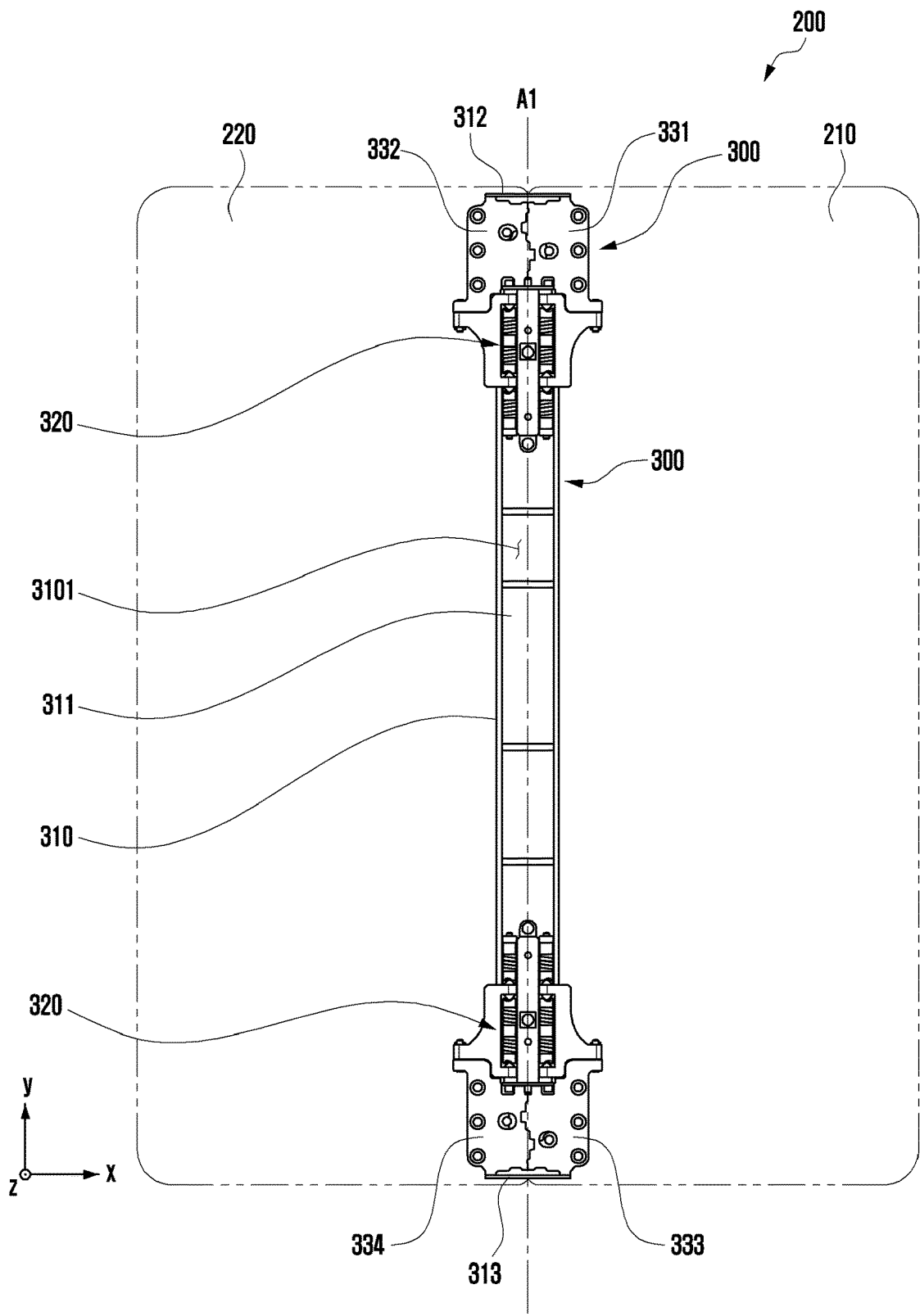
FIG. 5 is a schematic view of an electronic device illustrating an arrangement state of a hinge device according to an embodiment of the disclosure.

FIG. 5 is a schematic view of an electronic device illustrating an arrangement state of a hinge device according to an embodiment of the disclosure.

In the description of the electronic device 200 of FIG. 5, components substantially the same as those of the electronic device 200 of FIGS. 4A and 4B are denoted by the same reference numerals, and detailed descriptions thereof may be omitted for the sake of simplicity.

FIG. 5 illustrates an arrangement relationship between the hinge device 300 and the first and second housings 210 and 220 when the electronic device is in the unfolded state. According to an embodiment, the electronic device 200 may include a first housing 210, a second housing 220, and a hinge device 300 configured to rotatably connect the first housing 210 and the second housing 220. According to an embodiment, the hinge device 300 may include a hinge housing 310 having a length in the direction substantially parallel to the folding axis A1 (e.g., in the y-axis direction) and including an accommodation portion 3101, and at least one hinge module 320 including rotators 331, 332, 333, and 334 fixed to the accommodation portion 3101 of the housing 310 and fixed to the first housing 210 and the second housing 220. According to an embodiment, the rotators 331, 332, 333, and 334 may include a first rotator 331 and a second rotator 332 arranged in the accommodation portion 3101 of the hinge housing 310 near the first closed end 312 and coupled to the first housing 210 and the second housing 220, respectively. According to an embodiment, the rotators 331, 332, 333, and 334 may include a third rotator 333 and a fourth rotator 334 arranged in the accommodation portion 3101 of the hinge housing 310 near the second closed end 313 and coupled to the first housing 210 and the second housing 220, respectively.

Figure 6A:
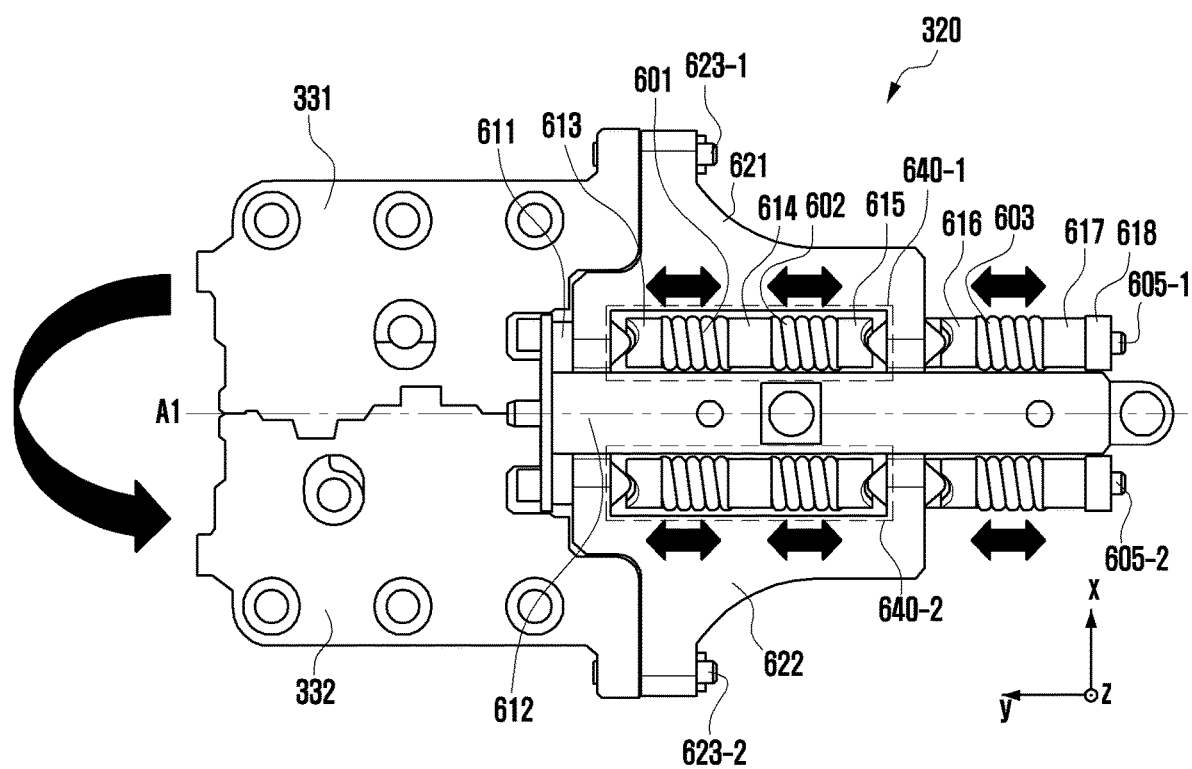
FIG. 6A is an exemplary view illustrating the front part of a hinge module according to an embodiment of the disclosure.
Figure 6B:
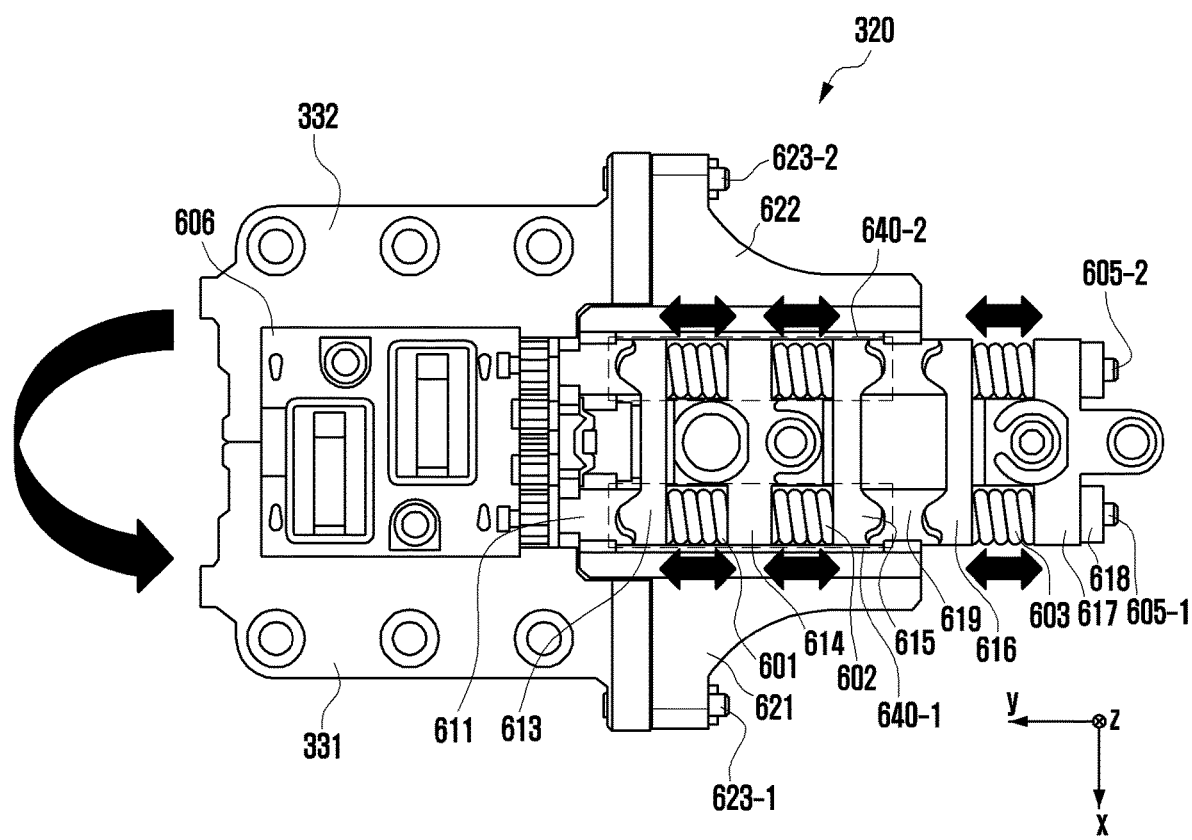
FIG. 6B is an exemplary view illustrating the rear part of a hinge module according to an embodiment of the disclosure.

FIG. 6A is an exemplary view illustrating the front part of a hinge module 320 according to an embodiment of the disclosure. FIG. 6B is an exemplary view illustrating the rear part of a hinge module according to an embodiment of the disclosure. The hinge module 320 illustrated FIGS. 6A and 6B is the hinge module 320 arranged adjacent to the first closed end (e.g., the first closed end 312 in FIG. 5), which is the upper area of the hinge housing (e.g., the hinge housing 310 in FIG. 3), According to an embodiment, the hinge modules 320 arranged in the upper area and/or the lower area of the hinge housing 310 may be configured with substantially the same components.

According to an embodiment, the hinge module 320 may include a first rotator 331 at least partially bonded to the first housing (e.g., the first housing 210 in FIG. 2), a second rotator 332 at least partially bonded to the second housing (e.g., the second housing 220 in FIG. 2), a center bar 612 (e.g., a hinge plate) arranged in a direction substantially parallel to the folding axis A1 (e.g., in the y-axis direction), a first arm 621 (e.g., first hinge housing) fixed to the first rotator 331 via a first pin 623-1 and a second arm 622 (e.g., second hinge housing) fixed to the second rotator 332 via a second pin 623-2, where the first and second arm support the folding operation and the unfolding operation of the electronic device 200. The first rotator 331, the second rotator 332, the center bar 612, the first arm 621, and the second arm 622 are may be implemented to have substantially the same plane as the first housing 210 and the second housing 220 when the electronic device (e.g., the electronic device 200 in FIG. 1) is in the unfolded state. To place the electronic device 200 in the folded state, the first rotator 331 and the second rotator 332 may perform the folding operation using the folding axis A1 (e.g., the center bar 612) as the center of the folding. For example, the first rotator 331 and the first arm 621 may be fixed via the first pin 623-1 and may move substantially together as one assembly. In addition, the second rotator 332 and the second arm 622 may be fixed via the second pin 623-2 and may move substantially together as one assembly. According to an embodiment, the first arm 621 may include a first accommodation portion 640-1 in which one or more components may be accommodated, and the second arm 622 may include a second accommodation portion 640-2 in which one or more components may be accommodated. According to an embodiment, the first accommodation portion 640-1 and the second accommodation portion 640-2 may be at least partially disposed in the accommodation portion (e.g., the accommodation portion 3101 in FIG. 4A) of the hinge device (e.g., the hinge device 300 in FIG. 3). The first arm 621 and the second arm 622 may be configured to be substantially the same, and hereinafter, the description of the first arm 621 may equally apply to the second arm 622. According to an embodiment, the hinge module 320 may be a component (e.g., assembly) that supports the electronic device 200 to perform the folding and unfolding operations.

According to an embodiment, the first rotator 331 and the second rotator 332 may be at least partially coupled to a rotator bracket 606. For example, the rotator bracket 606 may support the folding and unfolding of the first rotator 331 and the second rotator 332 when the electronic device performs the folding operation and the unfolding operation.

According to an embodiment, the electronic device 200 may include at least one shaft (e.g., first shaft 605-1 and second shaft 605-2) such that the folding operation and the unfolding operation are performed about the folding axis A1. For example, the at least one shaft may be arranged to at least partially penetrate the first arm 621 and the second arm 622. The first shaft 605-1 may move substantially together with the first housing 210, and the second shaft 605-2 may move substantially together with the second housing 220. According to an embodiment, the first arm 621 and the second arm 622 may be at least partially coupled to the cam bracket 619, and at least one shaft may pass through the cam bracket 619.

According to an embodiment, the first arm 621 may include, in the first accommodation portion 640-1, at least one cam assembly (e.g., the first cam 613 and the second cam 615), the center bar bracket 614, and/or at least one coil spring member (e.g., the first coil spring member 601 and second coil spring member 602). According to an embodiment, the at least one shaft (e.g., the first shaft 605-1) may fix at least one cam assembly arranged in the first accommodation portion 640-1, the center bar bracket 614, and/or the at least one coil spring member to the stopper 611 while at least partially penetrating at least one cam assembly, the center bar bracket, and/or the at least one coil spring member. For example, in the first accommodation portion 640-1, the first cam 613, the first coil spring member 601, the center bar bracket 614, the second coil spring member 602, and/or the second cam 615 may be sequentially disposed. The first accommodation portion 640-1 may be a portion of the accommodation portion 3101 of FIG. 4A.

According to an embodiment, the at least one shaft may be implemented to correspond to the length of the center bar 612 arranged in the direction substantially parallel to the folding axis A1 (e.g., in the y-axis direction). The at least one shaft may at least partially penetrate the at least one cam assembly (e.g., the third cam 616), the at least one coil spring member (e.g., the third coil spring 603), the shaft bracket 617, and the support member 618. The portion of the at least one shaft penetrating these components may correspond to an external area outside the first accommodation portion 640-1 of the first arm 621 (e.g., area outside the first accommodation portion 640-1 in the accommodation portion 3101). For example, the first shaft 605-1 may sequentially pass through the third cam 616, the third coil spring member 603, the shaft bracket 617, and the support member 618. According to an embodiment, a cam bracket 619 may be arranged between the second cam 615 and the third cam 616.

According to an embodiment, the at least one cam assembly (e.g., the first cam 613, the second cam 615, and the third cam 616), the center bar bracket 614, and/or the shaft bracket 617 may be implemented to be symmetrical about the center bar 612, and the position and shape thereof may be fixed. According to an embodiment, when the electronic device 200 performs the folding operation and the unfolding operation, the at least one shaft may perform a rotational movement in response to the performance of the operation. According to an embodiment, the at least one cam assembly (e.g., first cam 613, second cam 615, and third cam 616), the center bar bracket 614, and/or the shaft bracket 617 may be maintained to be fixed in place even when the electronic device 200 performs the folding operation and the unfolding operation, although the at least one cam assembly may rotate with the at least one shaft.

According to an embodiment, when the electronic device 200 performs the folding operation and the unfolding operation, the hinge module 320 may at least partially generate a pressing force in the at least one cam assembly, the at least one coil spring member, and the center bar bracket sequentially arranged in a direction substantially parallel to the folding axis A1. For example, the hinge module 320 may generate the pressing force by the folding operation and the unfolding operation with reference to an inflection point (e.g., a point at which at least one shaft is arranged).

According to an embodiment, the pressing force may be generated in response to the folding operation and the unfolding operation of the electronic device 200, and the at least one coil spring member (e.g., the first coil spring member 601, the second coil spring member 602, and/or the third coil spring member 603) may be at least partially contracted (e.g., compressed) or relaxed by the pressing force.

Figure 7A:
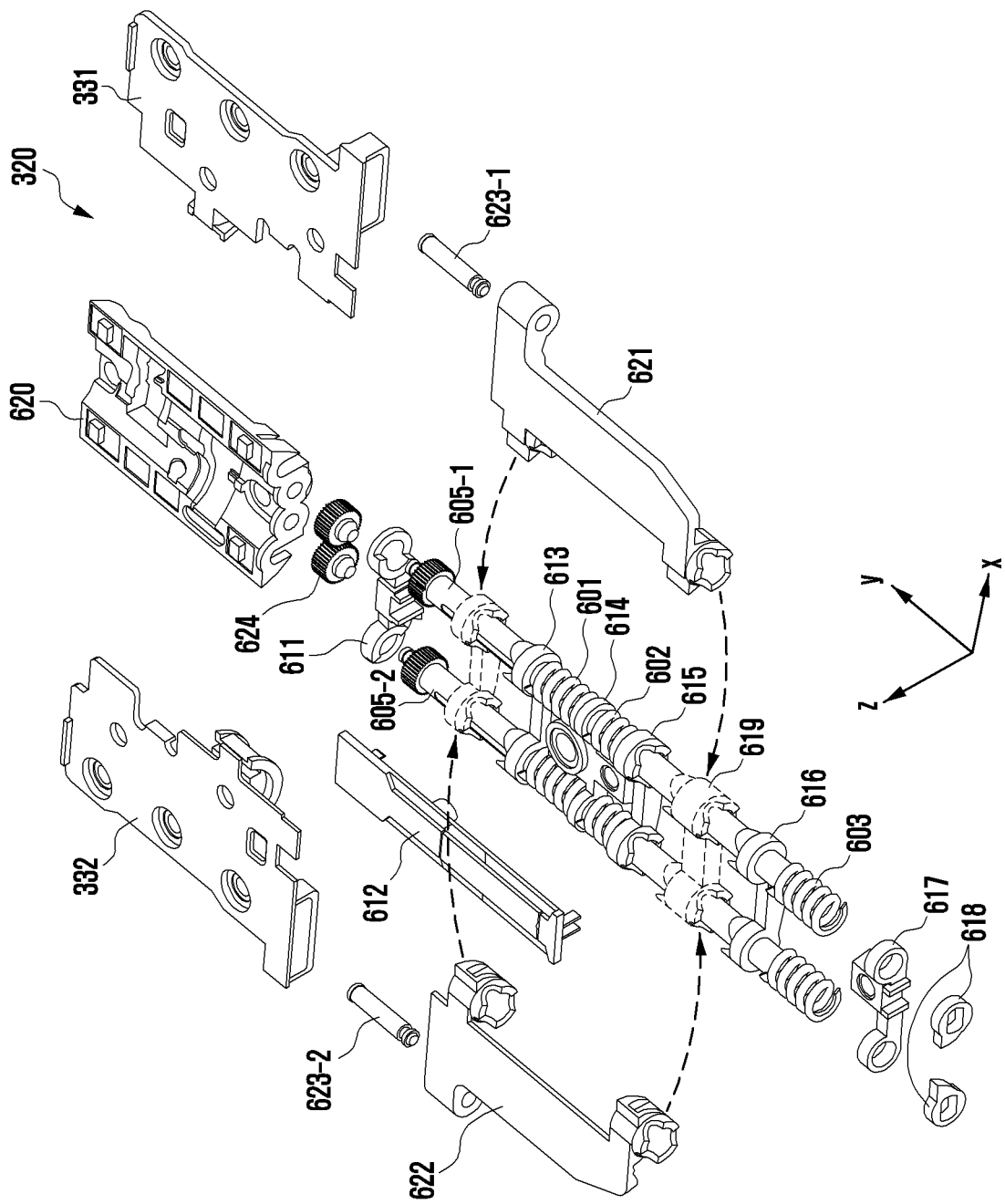
FIG. 7A is a front exploded perspective view of the hinge module according to an embodiment of the disclosure.
Figure 7B:
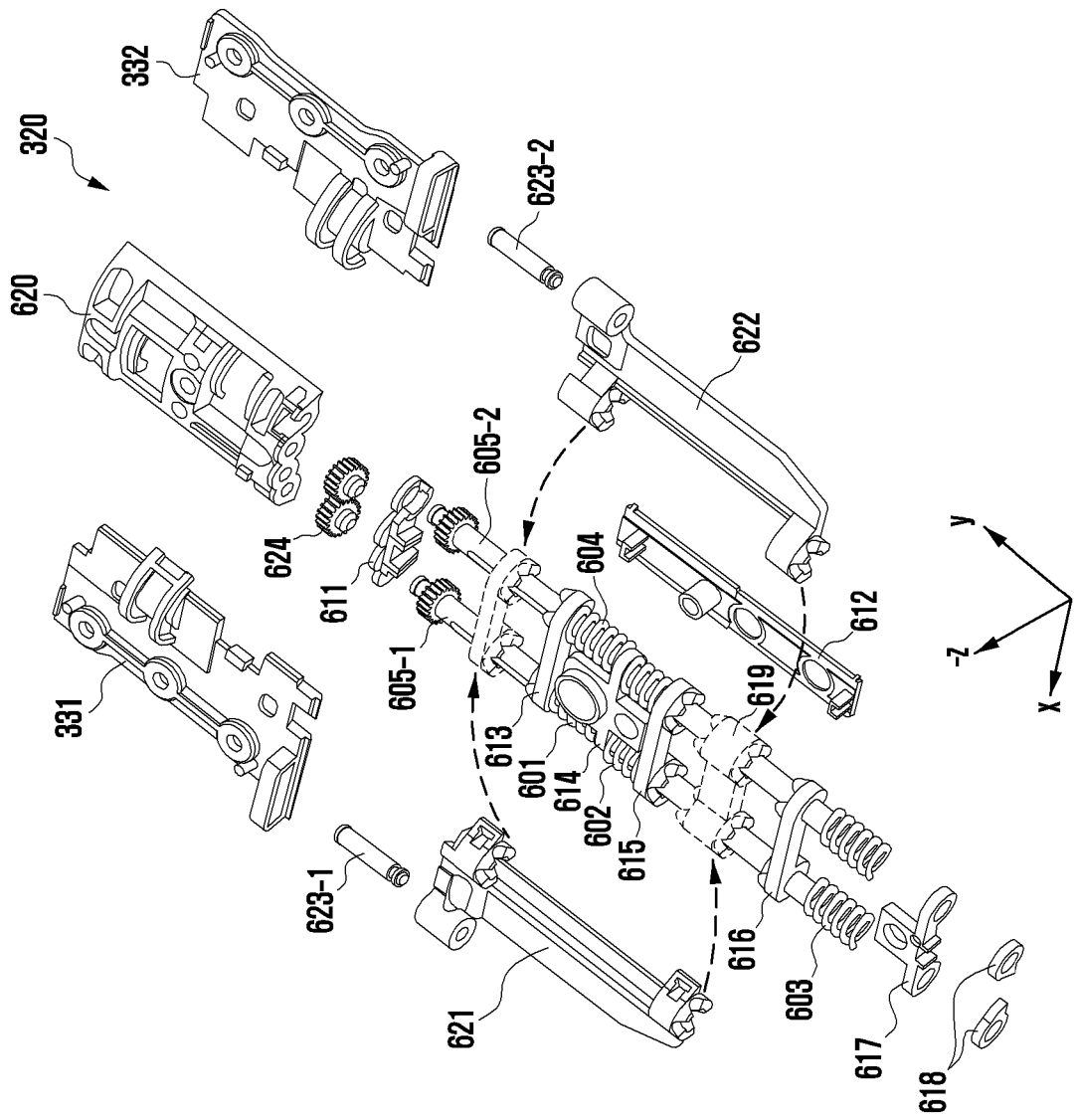
FIG. 7B is a rear exploded perspective view of the hinge module according to an embodiment of the disclosure.

FIG. 7A is a front exploded perspective view of the hinge module according to an embodiment of the disclosure. FIG. 7B is a rear exploded perspective view of the hinge module according to an embodiment of the disclosure.

FIG. 7A is a perspective view illustrating the front of the disassembled components of the hinge module, and FIG. 7B is a perspective view illustrating the rear of the disassembled components of the hinge module. FIG. 7A corresponds to FIG. 6A, and FIG. 7B corresponds to FIG. 6B.

According to an embodiment, the first rotator 331 at least partially bonded to the first housing (e.g., the first housing 210 in FIG. 2) and the second rotator 332 at least partially bonded to the second housing (e.g., the second housing 220 in FIG. 2) may at least partially support the folding operation and the unfolding operation of the electronic device about the center bar 612 arranged along the direction substantially parallel to the folding axis A1. The first rotator 331 and the second rotator 332 may be at least partially fixed by the rotator bracket 620.

According to an embodiment, the first arm 621 and the second arm 622 may accommodate at least one component, and may be implemented to be able to be penetrated by at least one shaft (e.g., the first shaft 605-1 and the second shaft 605-2).

According to an embodiment, the at least one shaft (e.g., the first shaft 605-1 and the second shaft 605-2) may be fixed to a stopper 611, and may be arranged to pass through at least one cam assembly (e.g., the first cam 613, the second cam 615, and the third cam 616), the center bar bracket 614, the at least one coil spring member (e.g., the first coil spring member 601, the second coil spring member 602, and the third coil spring member 603), the cam bracket 619, the shaft bracket 617, and/or the support member 618. For example, the first shaft 605-1 may sequentially pass through the first cam 613, the first coil spring member 601, the center bar bracket 614, the second coil spring member 602, the second cam 615, the cam bracket 619, the third cam 616, the third coil spring member 603, the shaft bracket 617 and/or the support member 618, starting from the stopper 611.

According to an embodiment, at least one shaft (e.g., the first shaft 605-1 and the second shaft 605-2) may be fixed to the stopper 611, and the stopper 611 may be at least partially fixed to the rotator bracket 620 via a gear member 624 (e.g., an idle gear). For example, the stopper 611 may be implemented such that at least one shaft (e.g., the first shaft 605-1 and the second shaft 605-2) can perform rotation movements at various angles. According to an embodiment, the folding and unfolding operations about the folding axis A1 done by the first rotator 331 and the second rotator 332 may be facilitated via the gear member 624. The first rotator 331 and the second rotator 332 may perform the folding and unfolding operations about the folding axis A1 by a predetermined angle.

According to an embodiment, the at least one coil spring member may be coiled in a specific direction (e.g., clockwise or counterclockwise), and a magnetic field may be generated based on the coiled direction. For example, the direction of the magnetic field may be determined based on the coiled direction. According to an embodiment, when a plurality of coil spring members coiled in the same direction are arranged adjacent to each other, generated magnetic fields may overlap each other, and the strength of the magnetic field may increase.

Figure 8:
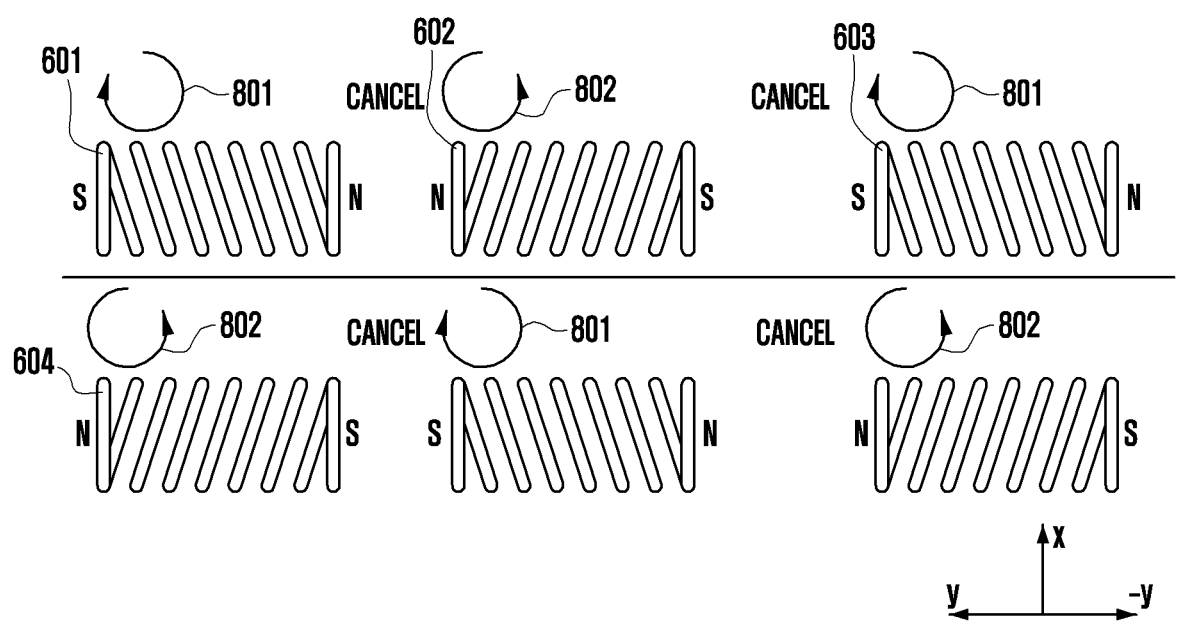
FIG. 8 is a first exemplary view illustrating an arrangement direction of coil spring members according to an embodiment of the disclosure.

FIG. 8 is a first exemplary view illustrating an arrangement direction of coil spring members according to an embodiment of the disclosure.

According to an embodiment, the electronic device (e.g., the electronic device 200 in FIG. 1, e.g. foldable electronic device) repeatedly performs the folding and unfolding operations using the hinge device (e.g., the hinge device 300 in FIG. 3). The electronic device 200 requires a certain level of rigidity when performing the folding operation and the unfolding operation. At least one hinge module 320 included in the hinge device 300 may be implemented in a structure in which at least some metal (e.g., metal structures) are included in order to increase the rigidity of the electronic device 200. The hinge module 320 may include at least one coil spring member in order to support rotational operations of the metal structures about at least one shaft (e.g., the first shaft 605-1 and the second shaft 605-2) or to prevent wear of the metal structures. For example, the at least one coil spring member may be repeatedly compressed or released. For example, the at least one coil spring member may be retracted or relaxed. When the electronic device 200 performs the folding operation and the unfolding operation, friction may occur between the metal structures included in the hinge module 320, and static electricity may be generated and accumulated in the hinge module 320 due to the friction. According to an embodiment, at least one coil spring member (e.g., first coil spring member 601, second coil spring member 602, and/or third coil spring member 603) included in the hinge module 320 may generate a magnetic field based on the accumulated static electricity.

According to an embodiment, the magnetic field may at least partially magnetize the metal structures, and may impair the uniformity of the H-field (e.g., magnetic field) of the digitizer included in a display (e.g., the first display 230 and the second display 400 in FIG. 1) of the electronic device 200. According to an embodiment, due to the magnetic field generated inside the electronic device 200, the digitizer may be damaged, and the accuracy of detection of inputs from the electronic pen may deteriorate.

According to an embodiment, the direction of the magnetic field may be determined based on the coiling direction of the at least one coil spring member included in the hinge module 320. For example, when a plurality of coil spring members arranged adjacent to each other (e.g., the first coil spring member 601 and the second coil spring member 602 in FIG. 6A) are coiled in the same direction, the first magnetic field generated based on the first coil spring member 601 and the second magnetic field generated based on the second coil spring member 602 may have the same magnetic field direction. The first magnetic field and the second magnetic field having the same magnetic field direction may at least partially overlap, and the strength of the combined magnetic field may be increased.

According to an embodiment, the first coil spring member 601 and the second coil spring member 602 included in the hinge module 320 may be coiled in opposite directions. According to an embodiment, the first coil spring member 601 and the second coil spring member 602 may be arranged in a configuration where they are penetrated by the first shaft (e.g., the first shaft 605-1 in FIG. 6A) arranged in the direction substantially parallel with the folding axis A1 of the electronic device 200 (e.g., in the y-axis direction). A center bar bracket (e.g., the center bar bracket 614 in FIG. 6A) may be arranged between the first coil spring member 601 and the second coil spring member 602, and the first coil spring member 601 and the second coil spring members 602 may be located adjacent to each other.

Referring to FIG. 8, the first coil spring member 601 may be coiled in a first direction 801 (e.g., clockwise), and the second coil spring member 602 may be coiled in a second direction 802 (e.g., counterclockwise). The first coil spring member 601 and the second coil spring member 602 may generate a magnetic field therearound based on the coiled directions thereof. For example, the first coil spring member 601 coiled in the first direction 801 may generate a first magnetic field, and the coiled second coil spring member 602 coiled in the second direction 802, which is opposite to the first direction 801, may generate a second magnetic field corresponding to the direction opposite to the first magnetic field. The first magnetic field and the second magnetic field are magnetic fields formed in opposite directions, and may cancel each other. The first magnetic field and the second magnetic field cancel each other, and the magnetization of the hinge module 320 may be reduced.

Referring to FIG. 8, the first magnetic field generated by the first coil spring member 601 and the second magnetic field generated by the second coil spring member 602 may cancel each other. The second magnetic field generated by the second coil spring member 602 and the third magnetic field generated by the third coil spring member 603 may cancel each other. According to an embodiment, the first coil spring member 601 and the second coil spring member 602 arranged to correspond to the first arm (e.g., the first arm 621 in FIG. 6A) may be coiled in opposite directions. According to an embodiment, in a second arm (e.g., the second arm 622 in FIG. 6A) arranged to be symmetrical to the first arm 621 with respect to the folding axis (e.g., the folding axis A1 in FIG. 6A), at least one coil spring member may be arranged. According to an embodiment, a plurality of coil spring members arranged to correspond to the second arm 622 may also be coiled in opposite directions.

Referring to FIG. 8, a fourth coil spring member 604 arranged to correspond to the second arm 622 may be arranged relatively close to the first coil spring member 601, and magnetic fields affect each other. The fourth coil spring member 604 may be coiled in a direction (e.g., the second direction 802, counterclockwise) opposite to the coiled direction (e.g., the first direction 801, clockwise) of the first coil spring member 601. For example, the first magnetic field generated by the first coil spring member 601 and the fourth magnetic field generated by the fourth coil spring member 604 may cancel each other.

Figure 9:
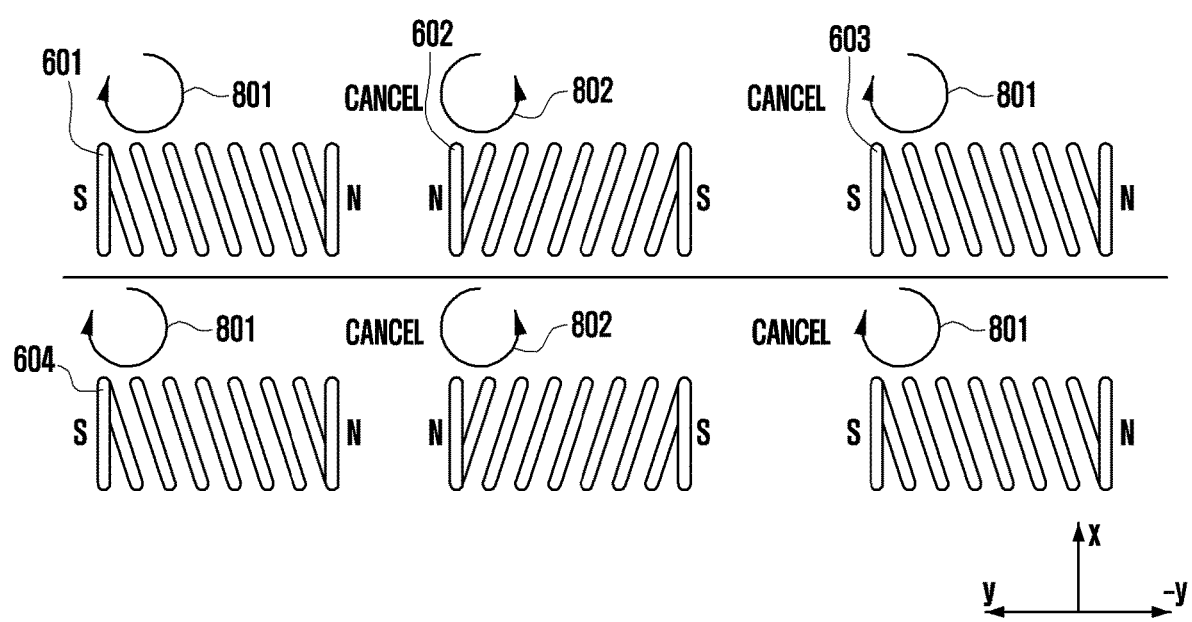
FIG. 9 is a second exemplary view illustrating an arrangement direction of coil spring members according to an embodiment of the disclosure.

FIG. 9 is a second exemplary view illustrating an arrangement direction of coil spring members according to an embodiment of the disclosure.

Referring to FIG. 9, the first coil spring member 601 may be coiled in a first direction 801 (e.g., clockwise), and the second coil spring member 602 may be coiled in a second direction 802 (e.g., counterclockwise). The first coil spring member 601 and the second coil spring member 602 may generate a magnetic field therearound based on the coiled directions thereof. For example, the first coil spring member 601 coiled in the first direction 801 may generate a first magnetic field, and the second coil spring member 602 coiled in the second direction 802, which is opposite to the first direction 801, may generate a second magnetic field corresponding to a direction opposite to the first magnetic field. The first magnetic field and the second magnetic field are magnetic fields formed in opposite directions, and may cancel each other. Since the first magnetic field and the second magnetic field cancel each other, and the magnetization of the hinge module 320 may be reduced.

According to an embodiment, the hinge module 320 may include a first arm (e.g., the first arm 621 in FIG. 6A) and a second arm (e.g., the second arm 622 in FIG. 6A) that are symmetrical with respect to the folding axis (e.g., the folding axis A1 in FIG. 6A). According to an embodiment, the first arm 621 may include the first coil spring member 601 and the second coil spring member 602, which are coiled in opposite directions. At least one coil spring member may also be arranged in the second arm 622 arranged symmetrical to the first arm 621. The second arm 622 may also be arranged in a state in which the coil spring members coiled in opposite directions are located adjacent to each other.

Referring to FIG. 9, the fourth coil spring member 604 arranged to correspond to the second arm 622 is arranged relatively close to the first coil spring member 601, but the spring members may be coiled in the same direction as each other.

According to an embodiment, the hinge module 320 may include at least one coil spring member, and the coil spring members (e.g., the first coil spring member 601 and the second coil spring member 602) arranged adjacent to each other may be coiled in opposite directions. The first magnetic field generated by the first coil spring member 601 and the second magnetic field generated by the second coil spring member 602 may cancel each other. According to an embodiment, magnetic fields generated between the coil spring members included in the hinge module 320 and located adjacent to each other may be canceled, and a magnetization phenomenon on the hinge module 320 may be reduced. According to an embodiment, in the electronic device 200, due to the decrease in the magnetization phenomenon, the H-field (e.g., magnetic field) of the digitizer included in a display (e.g., the first display 230 or the second display 400 of FIG. 1) can be maintained to be constant, and deterioration of the accuracy of the electronic pen can be prevented.

According to an embodiment, an electronic device (e.g., the electronic device 200 in FIG. 1) may include a first housing (e.g., the first housing 210 in FIG. 1), a second housing (e.g., the second housing 220 in FIG. 1), a hinge device (e.g., the hinge device 300 in FIG. 3) connecting the first housing 210 and the second housing 220 to each other to be foldable about a folding axis (e.g., the folding axis A1 in FIG. 1), a flexible display (e.g., the first display 230 in FIG. 2) arranged to be supported by at least a part of the first housing 210, the second housing 220, and the hinge device 300. The hinge device 300 includes a hinge housing (e.g., the hinge housing 310 in FIG. 3) including an accommodation portion (e.g., the accommodation portion 3101 in FIG. 4A), at least one cam assembly arranged in the accommodation portion 3101, at least two coil spring members configured to provide a pressing force to the at least one cam assembly in a direction parallel to the folding axis A1, and at least one hinge plate (e.g., the center bar 612 in FIG. 6) configured to support the at least one cam assembly and having a longitudinal length parallel to the folding axis. The at least two coil spring members may be coiled in opposite directions with respect to the folding axis A1.

According to an embodiment, the hinge device 300 may further include at least one shaft (e.g., the first shaft 605-1 and the second shaft 605-2 in FIG. 6A) arranged in the accommodation portion 3101 and passing through the at least one cam assembly and the at least two coil spring members.

According to an embodiment, the at least one cam assembly may include a first cam assembly (e.g., the first cam 613 in FIG. 6A) and a second cam assembly (e.g., the second cam 615 in FIG. 6A), and in the hinge device 300, the at least two coil spring members may be arranged between the first cam assembly 613 and the second cam assembly 615 along the at least one shaft (e.g., the first shaft 605-1).

According to an embodiment, the at least two coil spring members may include a first coil spring member (e.g., the first coil spring member 601 in FIG. 6A) and a second coil spring member (e.g., the second coil spring member 602 in FIG. 6A), and the hinge device 300 may further include a center bar bracket (e.g., the center bar bracket 614 in FIG. 6A) arranged between the first coil spring member 601 and the second coil spring member 602.

According to an embodiment, the first coil spring member 601 may be coiled along a first direction, and the second coil spring member 602 may be coiled along a second direction opposite to the first direction.

According to an embodiment, the position of the center bar bracket 614 may be fixed by the hinge plate 612.

According to an embodiment, the first cam assembly 613 and the second cam assembly 615 may be at least partially coupled to at least one bracket provided in the accommodation portion 3101.

According to an embodiment, the at least two coil spring members may be repeatedly compressed or relaxed by the pressing force.

According to an embodiment, the hinge device (e.g., the hinge device 300 in FIG. 3) may include a hinge housing (e.g., the hinge housing 310 in FIG. 3) including an accommodation portion (e.g., the accommodation portion 3101 in FIG. 4A), and at least one hinge module (e.g., the hinge modules 320 in FIG. 3) arranged in one end and the other end of the hinge housing 310. The at least one hinge module may include a first accommodation portion, which is a partial area of the accommodation portion 3101, and may include a first support member (e.g., the first arm 621 in FIG. 6A) and a second support member (e.g., the second arm 622 in FIG. 6A) foldable about a folding axis (e.g., the folding axis A1 in FIG. 1), at least one cam assembly arranged in the accommodation portion 3101, and at least two coil spring members configured to provide a pressing force to the at least one cam assembly in a direction parallel to the folding axis A1. The at least two coil spring members may be coiled in opposite directions with respect to the folding axis A1.

The hinge device 300 according to an embodiment may further include at least one shaft (e.g., the first shaft 605-1 and the second shaft 605-2 in FIG. 6A) arranged in the accommodation portion 3101 and passing through the at least one cam assembly and the at least two coil spring members.

According to an embodiment, the accommodation portion 3101 includes the first accommodation portion (e.g., the first accommodation portion 640-1 in FIG. 6A) and a second accommodation portion different from the first accommodation portion, and one of the at least two coil spring members may be arranged in the first accommodation portion 640-1 and another one of the at least two coil spring members may be arranged in the second accommodation portion.

According to an embodiment, the at least one cam assembly may include a first cam assembly (e.g., the first cam 613 in FIG. 6A) and a second cam assembly (e.g., the second cam 615 in FIG. 6A), and in the first accommodation portion 640-1, the at least two coil spring members may be arranged between the first cam assembly 613 and the second cam assembly 615 along the at least one shaft.

According to an embodiment, the at least two coil spring members may include a first coil spring member (e.g., the first coil spring member 601 in FIG. 6A) and a second coil spring member (e.g., the second coil spring member 602 in FIG. 6A), and a center bar bracket (e.g., the center bar bracket 614 in FIG. 6A) arranged between the first coil spring member 601 and the second coil spring member 602 may be further included.

According to an embodiment, the first coil spring member 601 may be coiled along a first direction, and the second coil spring member 602 may be coiled along a second direction opposite to the first direction.

According to an embodiment, the at least two coil spring members may include a first coil spring member (e.g., the second coil spring member 602 in FIG. 6A) and a second coil spring member (e.g., the third coil spring member 603 in FIG. 6A), wherein the first coil spring member 602 is arranged in the first accommodation portion 640-1 along the at least one shaft (e.g., the first shaft 605-1), and the second coil spring member 603 may be arranged in the second accommodation portion along the at least one shaft 605-1.

According to an embodiment, a cam bracket (e.g., the cam bracket 619 in FIG. 6A) arranged between the first coil spring member 602 and the second coil spring member 603 may be further included.

According to an embodiment, the cam bracket 619 may be coupled to the first support member 621 and the second support member 622 and may be fixed in position.

The hinge device 300 according to an embodiment may further include another cam assembly (e.g., the third cam 616 in FIG. 6A) coupled at least partially to the cam bracket 619 in the second accommodation portion, and a shaft bracket (e.g., the shaft bracket 617 in FIG. 6A) fixed to the hinge housing 310, and the second coil spring member 603 is arranged between the cam assembly 616 and the shaft bracket 617.

According to an embodiment, the second coil spring member 602 may be repeatedly compressed or relaxed by the pressing force.

According to an embodiment, the at least two coil spring members may include a first coil spring member 601 arranged to correspond to the first support member 621 and a second coil spring member (e.g., the fourth coil spring member 604 in FIG. 8) arranged to correspond to the second support member 622, wherein the first coil spring member 601 may be coiled along a first direction, and the second coil spring member 604 may be coiled along a second direction opposite to the first direction.

The electronic devices according to various embodiments disclosed in this document may be various types of devices. The electronic device may include, for example, a portable communication device (e.g., smart phone), a computer device, a portable multimedia device, a portable medical device, a camera, a wearable device, or a home appliance. The electronic devices according to embodiments of this document are not limited to the above-described devices.

It should be appreciated that various embodiments of the present disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar elements. A singular form of a noun corresponding to an item may include one or a plurality of items, unless the relevant context clearly indicates otherwise. As used in the disclosure, each of such phrases as "A or B," "at least one of A and B," "at least one of A or B," "A, B, or C," "at least one of A, B, and C," or "at least one of A, B, or C" may include any one or all possible combinations of the items enumerated together. Such terms as "$1^{st}$," "$2^{nd}$," "first," or "second" may be used to simply distinguish a corresponding component from another, and does not limit the components in other aspect (e.g., importance or order). If it is described that if an element (e.g., a first element) is referred to, with or without the term "operatively" or "communicatively", as "connected to," or "coupled to" another element (e.g., a second element), it means that the element may be connected to the other element directly (e.g., by wire), wirelessly, or via a third element.

According to various embodiments, each component (e.g., module or program) of the above-described components may include a single entity or multiple entities, and some of the plurality of entities may be disposed separately from other components. According to various embodiments, one or more of the above-described corresponding components or operations may be omitted, or one or more other components or operations may be added. Alternatively or additionally, a plurality of components (e.g., modules or programs) may be integrated into a single component, and the integrated single component may still perform one or more functions of the plurality of components in the same or similar manner as they are performed by the corresponding constituent elements among the plurality of constituent elements before being integrated.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. An electronic device comprising:
a first housing;
a second housing;
a hinge device configured to connect the first housing and the second housing to be foldable about a folding axis; and
a flexible display arranged to be supported by at least a part of the first housing, the second housing, and the hinge device,
wherein the hinge device includes:
a hinge housing including an accommodation portion;
at least one cam assembly arranged in the accommodation portion;
at least two coil spring members providing a pressing force to the at least one cam assembly in a direction parallel to the folding axis; and
at least one hinge plate configured to support the at least one cam assembly and having a longitudinal length parallel to the folding axis,
wherein a coiling direction for the at least two coil spring members provided in sequence along the direction parallel to the folding axis, are in opposite directions, thereby offsetting a magnetic field.

2. The electronic device of claim 1, wherein the hinge device further comprises at least one shaft arranged in the accommodation portion and passing through the at least one cam assembly and the at least two coil spring members.

3. The electronic device of claim 2, wherein the at least one cam assembly further comprises a first cam assembly and a second cam assembly, and
wherein, in the hinge device, the at least two coil spring members are arranged between the first cam assembly and the second cam assembly along the at least one shaft.

4. The electronic device of claim 3, wherein the at least two coil spring members include a first coil spring member and a second coil spring member, and
wherein the hinge device further includes a center bar bracket arranged between the first coil spring member and the second coil spring member.

5. The electronic device of claim 4, wherein the first coil spring member is coiled along a first direction, and the second coil spring member is coiled along a second direction opposite to the first direction.

6. The electronic device of claim 4, wherein a position of the center bar bracket is fixed by the hinge plate.

7. The electronic device of claim 3, wherein the first cam assembly and the second cam assembly are at least partially coupled to at least one bracket provided in the accommodation portion.

8. The electronic device of claim 1, wherein the at least two coil spring members are repeatedly compressed or relaxed by the pressing force.

9. A hinge device comprising:
a hinge housing including an accommodation portion; and
at least one hinge module arranged in one end and another end of the hinge housing,
wherein the at least one hinge module includes:
a first support member and a second support member including a first accommodation portion, which is a partial area of the accommodation portion, and configured to be foldable about a folding axis;
at least one cam assembly arranged in the accommodation portion; and
at least two coil spring members configured to provide a pressing force to the at least one cam assembly in a direction parallel to the folding axis, and
wherein a coiling direction for the at least two coil spring members provided in sequence along the direction parallel to the folding axis, are in opposite directions, thereby offsetting a magnetic field.

10. The hinge device of claim 9, further comprising:
at least one shaft arranged in the accommodation portion and passing through the at least one cam assembly and the at least two coil spring members.

11. The hinge device of claim 9, wherein the accommodation portion includes the first accommodation portion and a second accommodation portion different from the first accommodation portion, and
wherein one of the at least two coil spring members is arranged in the first accommodation portion and another one of the at least two coil spring members is arranged in the second accommodation portion.

12. The hinge device of claim 10, wherein the at least one cam assembly includes a first cam assembly and a second cam assembly, and
wherein the at least two coil spring members are arranged between the first cam assembly and the second cam assembly along the at least one shaft in the first accommodation portion.

13. The hinge device of claim 12, wherein the at least two coil spring members include a first coil spring member and a second coil spring member, and
wherein the hinge device further includes a center bar bracket arranged between the first coil spring member and the second coil spring member.

14. The hinge device of claim 13, wherein the first coil spring member is coiled along a first direction, and the second coil spring member is coiled along a second direction opposite to the first direction.

15. The hinge device of claim 11, wherein the at least two coil spring members include a first coil spring member and a second coil spring member, and
wherein the first coil spring member is arranged along at least one shaft in the first accommodation portion, and the second coil spring member is arranged along the at least one shaft in the second accommodation portion.

16. The hinge device of claim 15, further comprising:
a cam bracket arranged between the first coil spring member and the second coil spring member.

17. The hinge device of claim 16, wherein the cam bracket is coupled to the first support member and the second support member, and is fixed in position.

18. The hinge device of claim 16, further comprising:
another cam assembly at least partially coupled to the cam bracket in the second accommodation portion; and
a shaft bracket fixed to the hinge housing,
wherein the second coil spring member is arranged between the cam assembly and the shaft bracket.

19. The hinge device of claim 18, wherein the second coil spring member is repeatedly compressed or relaxed by the pressing force.

20. The hinge device of claim 9, wherein the at least two coil spring members include a first coil spring member arranged to correspond to the first support member and a second coil spring member arranged to correspond to the second support member, and
wherein the first coil spring member is coiled along a first direction, and the second coil spring member is coiled along a second direction opposite to the first direction.

* * * * *